United States Patent [19]

Le Can et al.

[11] 3,777,230

[45] Dec. 4, 1973

[54] SEMICONDUCTOR DEVICE WITH ISOLATED CIRCUIT ELEMENTS

[75] Inventors: Claude Jan Principe Frederic Le Can; Walter Steinmaier, both of Nijmegen, Netherlands

[73] Assignee: U.S. Philips Corporation , New York, N.Y.

[22] Filed: Feb. 5, 1973

[21] Appl. No.: 329,846

Related U.S. Application Data

[63] Continuation of Ser. No. 153,590, June 16, 1971, abandoned.

[30] Foreign Application Priority Data

June 20, 1970 Netherlands ........................ 7009091

[52] U.S. Cl. ...... 317/235 R, 317/235 D, 317/235 E, 148/175

[51] Int. Cl. .............................................. H01l 19/00

[58] Field of Search ..................... 317/235 D, 235 E, 317/235 G; 148/175

[56] References Cited

UNITED STATES PATENTS

| | | | |
|---|---|---|---|
| 3,254,277 | 5/1966 | Aarons | 317/235 |
| 3,404,295 | 10/1968 | Warner | 317/235 |
| 3,518,510 | 6/1970 | Lamming | 317/235 |
| 3,581,165 | 5/1971 | Seelbach | 317/235 |
| 3,676,755 | 7/1972 | Glaise | 317/235 |

OTHER PUBLICATIONS

Electronics, "Integrated–Circuit Oscillator Requires Few Components" by Srgano et al., Dec. 13, 1963, page 40.

IBM Tech. Discl. Bul., "Transistor With Pull–Down Resistor" by Wu, Vol. 11, No. 11, April, 1969, page 1,439.

IBM Tech. Discl. Bul., "Component Interconnection For Integrated Circuits" by Augusta et al., Vol. 8, No. 12, May, 1966, pages 1,843–1,844.

*Primary Examiner*—Jerry D. Craig
*Attorney*—Frank R. Trifari

[57] ABSTRACT

An integrated circuit comprising at least an insulated transistor which is connected to a transistor, the circuit elements being provided in a surface layer of a semiconductor device which is present on a base layer or substrate of the same one conductivity type and has a lower resistivity. The insulated transistor is present within a cup-shaped insulation zone of the opposite conductivity type. The said resistor is at least partly formed by the lateral resistor in the surface layer between the active part of the transistor and an aperture in the insulation zone through which the resistor is electrically connected to the substrate.

11 Claims, 9 Drawing Figures

Figure 1:
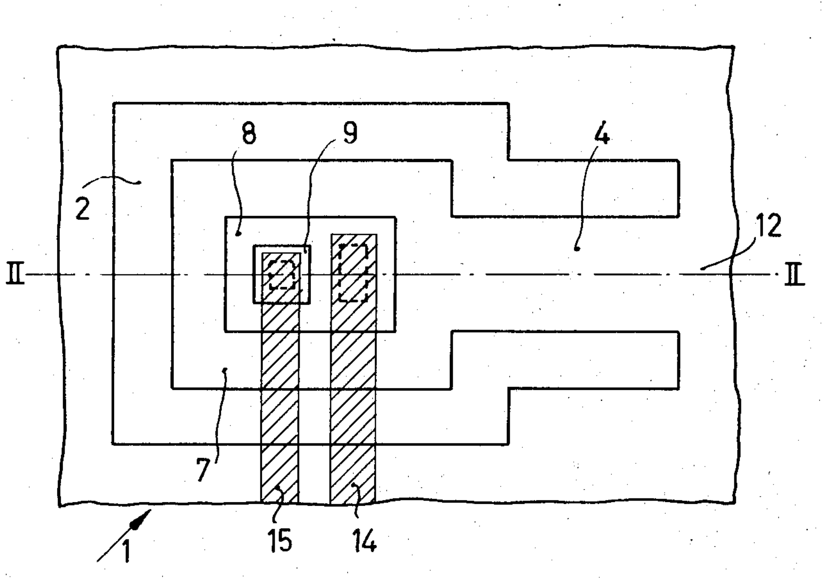

*INVENTORS*
CLAUDE J.P.F. LE CAN
WALTER STEINMAIER
*BY*
[signature]
AGENT

INVENTORS
CLAUDE J.P.F. LE CAN
WALTER STEINMAIER
BY
[signature]
AGENT

*INVENTORS*
CLAUDE J.P.F. LE CAN
WALTER STEINMAIER
*BY*
AGENT

*INVENTORS*
CLAUDE J.P.F. LE CAN
WALTER STEINMAIER
*BY*
AGENT

SEMICONDUCTOR DEVICE WITH ISOLATED CIRCUIT ELEMENTS

This is a continuation of application Ser. No. 153,590, filed June 16, 1971 now abandoned.

The invention relates to a semiconductor device comprising a semiconductor body in which a number of circuit elements are integrated among which at least a circuit element separated from other circuit elements by means of an insulation zone, said circuit element being connected to a resistor.

It frequently occurs in circuit arrangements that a circuit element, for example, a diode or a transistor, is connected to a further point in the circuit via a resistor. For example, the collector of a bipolar transistor is often connected to the supply via a resistor. In that case often also one or more collectors of transistors connected, for example, as emitter-followers, are connected directly to the supply.

In the commonly used method of integrating in a semiconductor body a number of mutually insulated islands are used in which usually a number of resistors is provided in one island. The remaining islands comprise, for example, one or more active circuit elements. The semiconductor zone in question of the circuit element connected to the resistor is connected to a metal track which extends over an insulating layer present on the semiconductor body and which leads to one of the said resistors.

It is the object of the present invention to provide a new structure for the said combination of circuit elements and resistors which can simply be realized.

The invention is inter alia based on the recognition of the fact that the said circuit element is often connected, via the relative resistor, to a point of reference potential, for example, to one of the terminals of a supply voltage source, and that it is furthermore of advantage for many circuit arrangements to use a semiconductor body having a surface layer and a substrate of the same conductivity type instead of starting from the more conventionally used semiconductor body having a substrate of one conductivity type and an epitaxial layer of the opposite conductivity type.

The invention is furthermore based on the recognition of the fact that it is recommendable to keep the metallisation pattern for the connection of the various circuit elements as simple as possible and, if possible, to realize said connections without a metal track internally in the semiconductor body.

According to the invention, a semiconductor device of the type mentioned in the preamble is characterized in that the circuit elements are provided in a surface layer of the one conductivity type of the semiconductor body, which layer extends over a layer of the one conductivity type which is common for the circuit elements and has a lower resistivity than the surface layer, the said circuit element connected to the resistor comprising a number of semiconductor zones determining the active part of the element, among which at least a first zone which is a part of the surface layer and a second zone which is of the opposite conductivity type and extends from the surface of the surface layer in the said part, the insulation zone being cup-shaped and having a bottom portion which extends at the boundary of the surface layer and the common layer and having a wall portion which extends from the bottom portion through the surface layer to the surface, the cup-shaped zone in the semiconductor body substantially entirely surrounding the first and the second zone and, at a place shifted laterally in the plane of the surface layer relative to the active part of the surface element, having an aperture through which the first zone is conductively connected to the common layer, the said resistor being formed at least partly by the lateral resistor in the surface layer between the active part of the circuit element and the aperture in the insulation zone.

It is to be noted that the active part of the circuit element is to be understood to mean herein in the case of a diode, the region present in the immediate proximity of the rectifying junction and, in the case of a transistor, the region where during operation the actual transistor action occurs, or, in other words, the region in which the transport of charge carriers involved in the transistor action takes place at least mainly.

The important advantage of the use of a low-ohmic common layer, preferably in the form of a low-ohmic substrate, is that said layer can be used as an earth plane, in general as a plane having a reference potential, as a result of which the electric action of the integrated circuit is often improved. Moreover, said layer may be used as a supply connection as a result of which the metallisation pattern present on the surface for the mutual connections becomes simpler.

The invention furthermore provides a semiconductor device having one or more insulated, at least mutually separated, active circuit elements a semiconductor zone of which is connected in a very simple manner to the remaining part of the circuit via a resistor, no metal tracks being necessary for the connection of the said resistor. The lateral resistor in the semiconductor body immediately adjoins the relative semiconductor zone of the element and furthermore coheres immediately via the aperture with the semiconductor material present outside the cup-shaped insulation zone.

The common layer preferably serves as a low-ohmic connection, for example, as a supply connection, for the integrated circuit.

The insulation zone may be, for example, of an insulating material or of a substantially intrinsic, at least very high-ohmic, semiconductor material. The insultion zone, however, preferably consists at least partly of a semiconductor zone of the opposite conductivity type. In that case, the bottom portion is preferably provided as a buried layer of the opposite conductivity type at the boundary of the common layer and an epitaxial layer forming the surface layer. The wall portion of the insulation zone can simply be obtained by diffusion or may consist entirely or partly of a sunken isolating layer.

An important embodiment of the semiconductor device according to the invention is characterized in that at least one further circuit element is present outside the insulation zone, one of the semiconductor zones of the further circuit element forming part of the region of the one conductivity type adjoining the insulation zone, the common layer serving as an electric connection of said zone as a result of which the said zone is also connected to the first zone via the said resistor.

The further circuit element preferably is a transversal bipolar transistor. The common layer may then be used as an emitter connection but preferably it forms the collector connection, the base zone being a zone of the opposite conductivity type which adjoins the surface and which surrounds at least an emitter zone in the semiconductor body.

Such a combination of two circuit elements which are interconnected via a resistor often occurs in circuit arrangements. The further circuit element in this case is often connected as an emitter-follower. The use of the invention inter alia has the important advantage for that such emitter-followers no insulated islands are necessary. As a result of this less space is necessary for said transistors and the output can be higher during the manufacture. Furthermore, the choice of the location of said further transistor is not so restricted as a result of which the metallisation pattern for the connections can be kept similar.

Although the aperture may be formed by a recess in the bottom portion, it is preferably present in the wall portion of the insulation zone.

In this manner a lateral distance which is as large as possible between the circuit element and the aperture and hence a resistance which is as large as possible can be obtained with a comparatively small space at the semiconductor surface.

A further embodiment of the semiconductor device according to the invention is characterized in that the wall portion of the insulation zone for the greater part surrounds the region of the one conductivity type which comprises the first zone and the lateral resistor and shows an interruption at the area of the aperture. At the semiconductor surface, the wall portion in this case has a geometry which is closed with the exception of the interruption and is, for example, in the form of a U or a horseshoe.

In particular if the circuit element is connected to the supply via the resistor, the resistance value of the resistor in many cases is preferably large so as to keep the dissipation of the circuit element small. In this connection it is of importance that the resistance per square of the surface layer will usually be considerably higher than that of the commonly used resistance zones diffused simultaneously with the base zone of transistors, as a result of which the resistors having said higher resistance values also occupy only a comparatively small part of the semiconductor surface. Furthermore, a further surface zone of the opposite conductivity type may simply be used for very high resistances, which zone covers the lateral resistor for a more or less large part as a result of which the resistor extends at least partly between said further surface zone and the bottom portion of the insulation zone. The further surface zone may be connected, for example, via a metal track, to a point of suitable potential in the circuit, the p-n junction between said further surface zone and the lateral resistor being biased in the reverse direction, the resistance value being controllable by means of said potential and the expansion of the depletion layer of the said p-n junction dependent thereon.

The further surface zone of the opposite conductivity type preferably extends, at least at the area of the interruption, in the wall portion of the insulation zone.

An important embodiment of the semiconductor device according to the invention is characterized in that the further surface zone at the semiconductor surface coheres with the wall portion of the insulation zone. The insulation zone will usually be applied to a potential at which the p-n junction between the insulation zone and the surface layer and the common layer are biased in the reverse direction so as to ensure a good electric separation between the circuit element and the remaining part of the circuit. Usually the said potential will also be suitable for the further surface zone, because both zones are of the opposite conductivity type, and the p-n junction bounding the further zone is also biased in the reverse direction. Due to the said coherence of the two zones a connection is present in the semiconductor body and a conductive track on the insulating layer is saved.

The further surface zone can simply be provided simultaneously with the second zone in the semiconductor body so that for this purpose no extra processing is necessary during the manufacture. Such a preferred embodiment is characterized in that the second zone and the further surface zone extend from the semiconductor surface to substantially the same depth in the surface layer.

The circuit element connected to the resistor may be, for example, a diode or a field effect transistor. In the last-mentioned case the first zone comprises, for example, the channel region and the source and drain electrodes. The second zone in this case constitutes a gate electrode which is, for example, annular and surrounds the source and drain electrode. The gate electrode may alternatively be elongate and cohere at the surface with the insulation zone. The lateral resistor, for example, immediately adjoins the drain electrode.

The circuit element in question preferably is a bipolar transistor, the first zone constituting either the collector zone or the base zone. In the first case the second zone is the base zone and surrounds an emitter zone of the one conductivity type in the semiconductor body. In the second case the second zone may be, for example, the emitter zone. The collector zone may be formed by the buried part of the insulation zone, by a third zone which is of the opposite conductivity type and extends in the first zone, or by the wall portion of the insulation zone.

If the second zone is the base zone of a vertical transistor, a further space saving is possible by constructing the second zone as an extension of the wall portion of the insulation zone. This important preferred embodiment of a semiconductor device according to the invention is characterized in that the second zone coheres at the surface with the cup-shaped insulation zone.

In this manner the base zone of the transistor actually also serves for the insulation. In addition to the said space saving, this has other advantages. In connection with the fact that in logical circuits the base-collector junction of a transistor may sometimes come in the forward direction as a result of which charge carriers are injected in the collector zone, it is inter alia of importance that said collector zone nowhere adjoins a zone or a substrate region which in the said circumstances may serve as a collector of a parasitic transistor. In the conventional structures in which this is the case indeed, large leakage currents may be the result.

For completeness' sake it is to be noted that the self-insulating transistor in which the base zone also serves for the insulation of the transistor is the subject matter of the Dutch patent application . . . . (PHN. 4911).

The first zone of the circuit element may be provided with a conductive contact at the semiconductor surface. Such a contact is preferably present beside and at a small distance from the second zone so that the distance between the second zone and the contact is smaller than that between the contact and the aperture. The lateral resistor is formed by the semiconductor material which extends between said contact and the aperture in the insulation zone. When a further surface zone is used, the said contact is preferably present at the surface between the second zone and the further surface zone.

In order to decrease the series resistance in the first zone of the circuit element, a so-called buried layer may be used. In that case a part of the first zone in which the doping concentration in a direction transverse to the surface increases with the distance to the surface is present between the bottom portion of the insulation zone and the second zone. Such a buried layer preferably extends laterally in the direction of the layer to below the conductive contact of the first zone.

In the preceding paragraph it was emphasized that when using the invention, in particular high resistance values can advantageously be realized. However, the present invention is equally important for circuit arrangements having comparatively small resistors.

An important embodiment of the semiconductor device according to the invention is characterized in that the buried layer, i.e. the above-mentioned part with increasing concentration, extends laterally in the plane of the surface layer from below the second zone at least up to the aperture in the insulation zone.

In this embodiment the resistance value of the lateral resistor is at least mainly determined by the buried layer which usually shows a much higher doping concentration than the surface layer. As a result of this the resistance value is substantially independent of the thickness of the surface layer. As a result of this, said smaller resistors can be constructed also to have a great accuracy of the resistance value.

Figure 2:
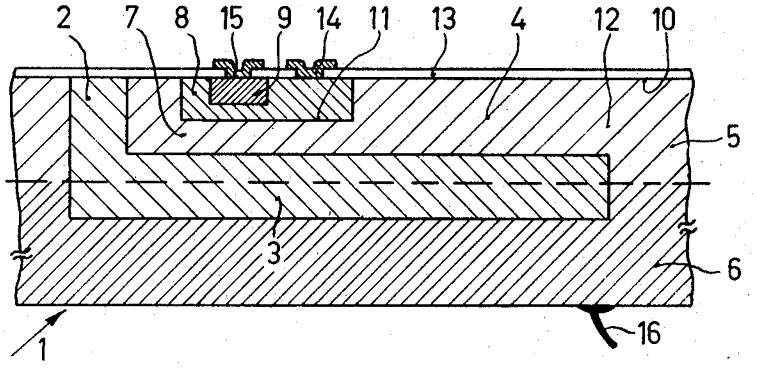

In order that the invention may be readily carried into effect, a few examples thereof will now be described in greater detail, with reference to the accompanying drawings, in which FIG. 1 is a diagrammatic plan view of a part of a first example of the semiconductor device according to the invention, and FIG. 2 is a diagrammatic cross-sectional view of the said part of the said semiconductor device taken on the line II—II of FIG. 1.

Figure 3:
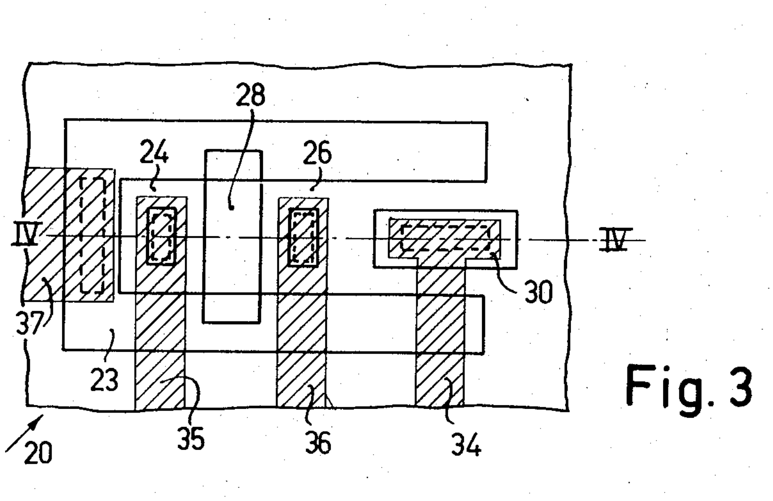
Figure 4:
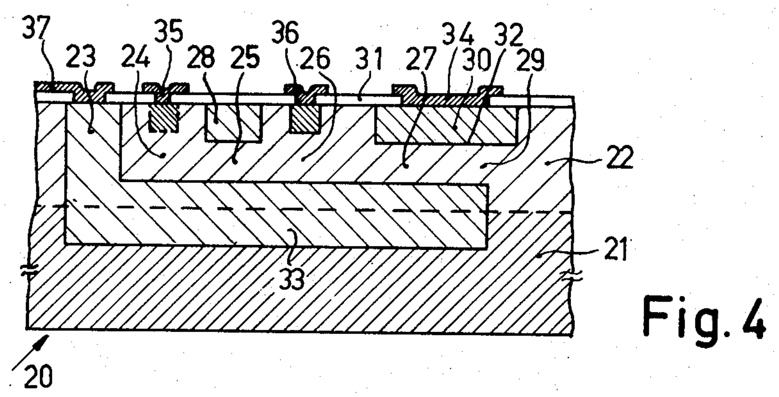
Figure 5:
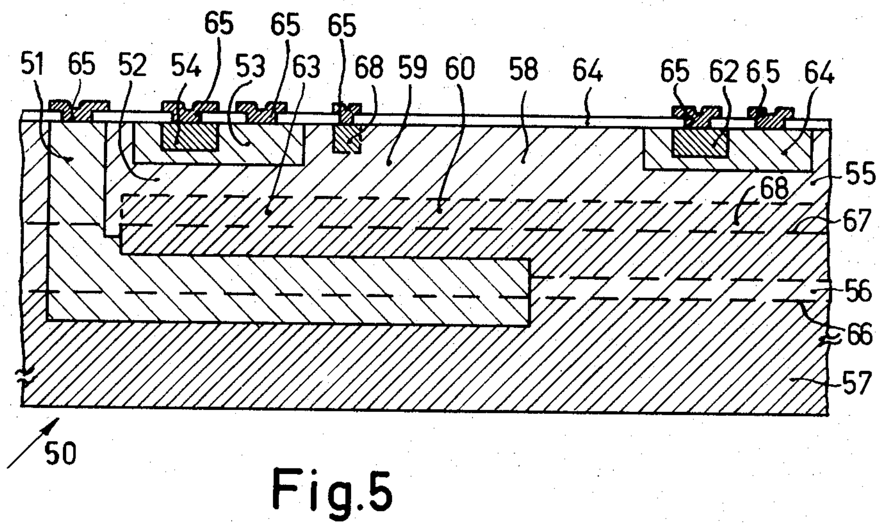
Figure 6:
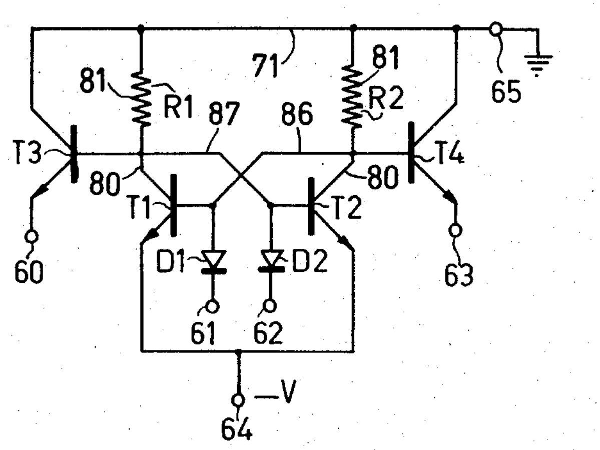
Figure 7:
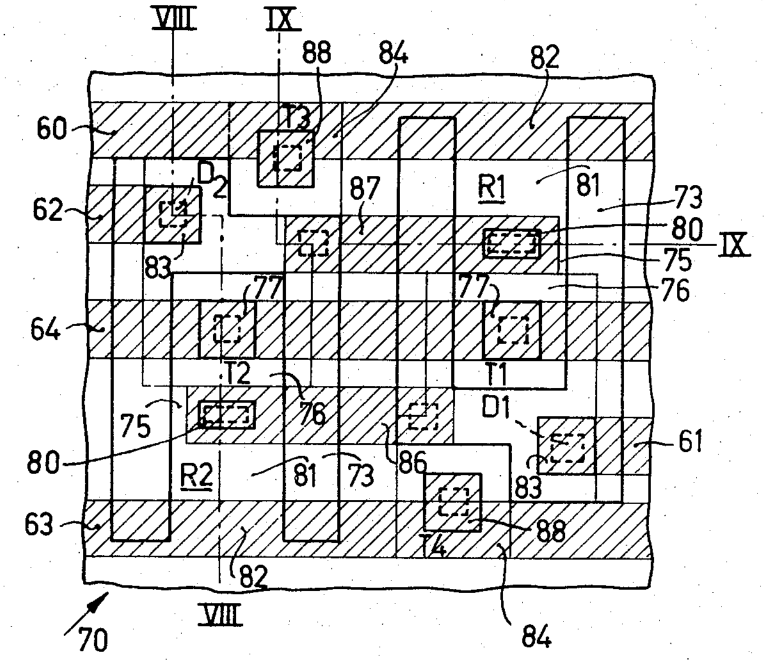
Figure 8:
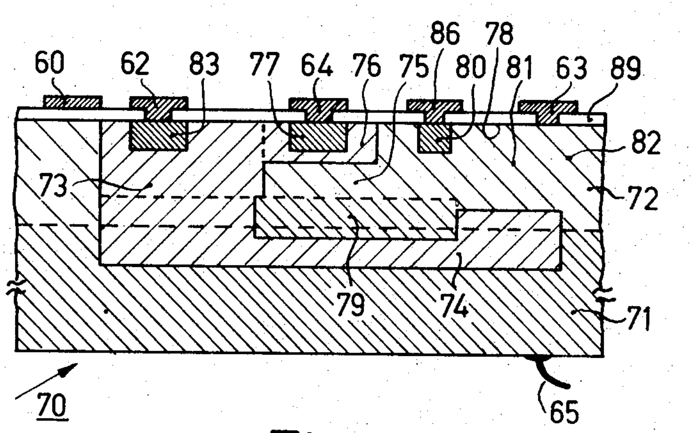
Figure 9:
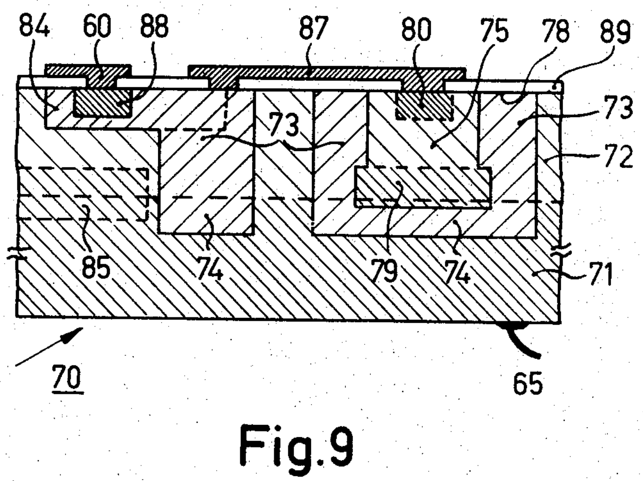

FIG. 3 is a diagrammatic plan view of a part of a second example of the semiconductor device according to the invention and FIG. 4 is a diagrammatic cross-sectional view of said semiconductor device taken on the line IV—IV of FIG. 3, FIG. 5 is a diagrammatic cross-sectional view of a further example of the semiconductor device according to the invention, FIG. 6 shows an electric circuit diagram of a flip-flop, while FIG. 7 is a diagrammatic plan view of a semiconductor device according to the invention comprising the flip-flop shown in FIG. 6, FIGS. 8 and 9 are diagrammatic cross-sectional views of the semiconductor device shown in FIG. 7, taken on the line VIII—VIII and IX—IX, respectively, of FIG. 7.

A first example which will be described with reference to FIGS. 1 and 2 is a semiconductor device having a semiconductor body 1 in which a number of circuit elements are integrated, among which at least a circuit element separated from other circuit elements (not shown in the Figures) by means of an insulation zone 2,3, the said circuit element being connected to a resistor 4.

According to the invention the circuit elements are provided in a surface layer 5 of the one conductivity type which layer extends over a layer 6 of the one conductivity type which is common for the circuit elements and which has a lower resistivity than the surface layer 5. In the present example the common layer 6 is in the form of a low-ohmic substrate and the surface layer 5 is an epitaxial layer which is provided on the substrate 6.

The circuit element comprises a number of semiconductor zones 7, 8 and 9 determining the active part of the element among which at least one first zone which forms part of the surface layer 5 and a second zone 8 which is of the opposite conductivity type and extends from the surface 10 of the surface layer 7 in the said part 7. The zones 7 and 8 constitute a p-n junction 11 which may be used as a diode in a circuit arrangement. In the present example said p-n junction is the base-collector junction of a transversal or vertical bipolar transistor, the zone 8 which forms the base zone of the transistor surrounding an emitter zone 9 of the one conductivity type in the semiconductor body.

The insulation zone 2,3 is cup-shaped and has a bottom portion 3 which extends at the boundary of the surface layer 5 and the common layer, and has a wall portion 2 which extends from the bottom portion 3 through the surface layer 5 up to the surface 10. This cup-shaped insulation zone 2, 3 substantially entirely surrounds the first zone 7 and the second zone 8 in the semiconductor body and comprises, at a location shifted laterally in the plane of the surface layer 5 relative to the active part of the circuit element determined by the zones 7, 8 and 9, an aperture 12 through which the first zone 7 is conductively connected to the common layer 6. The resistor 4 present in said connection is formed by the lateral resistor in the surface layer 5 between the active part of the circuit element and the aperture 12 in the insulation zone 2,3.

An insulation layer 13 on which conductive tracks 14 and 15 extend which are connected to the base zone 8 and the emitter zone 9 via apertures in the insulating layer, is present on the semiconductor surface 10.

For the integrated circuit the common layer 6 serves as an earth plane or in general as a plane having a reference potential. Such a low-ohmic earth plane favourably influences the electric action of the circuit. For the electric connection of the layer 6, the semiconductor body can be soldered in normal manner to a conductor, for example, the bottom of an envelope. The connection of the common layer 6 is diagrammatically shown in FIG. 2 by means of the conductor 16. In the operating condition said connection is preferably connected to one of the terminals of the supply voltage source, as a result of which the pattern of conductive tracks on the insulating layer for the mutual connection of the circuit becomes simpler. Actually, as compared with the conventional integrated circuits, a conductive track for the supply voltage is saved. In this connection it is also of importance that for the connection of the resistor no conductive tracks are necessary. The connections in question are realized internally in the semiconductor body, the resistor 4 immediately adjoining the zone 7 and, through the aperture 12, also the surface layer 5 and the common layer 6.

The insulation zone 2, 3 may consist of insulating material or of substantially intrinsic or very high-ohmic semiconductor material. In the present example, the insulation zone 2, 3 is a semiconductor zone of the opposite conductivity type. The bottom portion 3 is a buried layer which has been provided on the surface of the substrate 6 prior to the growing of the epitaxial layer 5. The wall portion 2 may be provided, for example, by diffusion from the surface 10 or may consist entirely or partly of a sunken insulating layer.

In a second example the surface element is a field effect transistor. The semiconductor body 20 (FIGS. 3 and 4) comprises a low-ohmic substrate 21 and a high-ohmic surface layer 22 which are both of the one conductivity type. The cup-shaped insulation zone 23, 33 of the opposite conductivity type substantially entirely surrounds a part 23, 25, 26, 27 of the surface layer 5. This part comprises a source electrode 24, a channel region 25 and a drain electrode 26 of a field effect transistor. The second zone 25 is elongate and coheres with the insulation zone 23, 33. The zones 28 and 23, 33 together constitute the gate electrode of the transistor. The drain electrode 26 in the surface layer 5 immediately adjoins a part 27 which forms a lateral resistor and which is situated in the plane of the layer between the drain electrode 26 and an aperture 29 in the wall portion 23 of the insulation zone 23, 33. The source and drain eletrodes and the gate electrode are connected to conductive tracks 35, 36 and 37 in normal manner via apertures in the insulating layer 31.

In many circuit arrangements the circuit element is connected to the supply via a high-value resistor so as to keep the dissipation of the element low. Such high resistance values can be realized simply by using the invention. First of all the resistance per square of the surface layer 22 usually is much higher than that of the resistance zones used in the conventional integrated circuits and provided simultaneously with the base zones of transistors. Normal values for the resistance per square of the surface layer are, for example, of the order of from 1 to 2 kOhm , while the resistance per square of the conventional resistance zones usually is 150 to 200 ohm. As a result of this, comparatively small space is necessary for resistors having a high resistance value, when using the invention.

Furthermore, the resistance value can simply be further increased by using a further surface zone 30 which may consist of insulating material or which, as in the present example, may be a surface zone of the opposite conductivity type, the lateral resistor 27 extending at least partly between said zone 30 and the bottom portion 33 of the insulation zone 23, 33. In this manner the thickness of the part 27 of the surface layer 22 in a direction transverse to the surface can be reduced, for example, to approximately half of that of the parts 24 and 25. Furthermore, the zone 30 can be connected, via an aperture in the insulating layer 31 and a conductive track 34, to a point in the circuit having a suitable potential in such manner that the p-n junction 32 between the zone 30 and the part 27 of the surface layer 22 is biased in the reverse direction, the resistance value being further controllable in accordance with the expansion of the depletion layer of the p-n junction 32 by means of the applied potential. This influence of the resistance value occurs analogous to the influence of the conductivity in the channel region 25 of the field effect transistor by means of the gate electrode 23, 33, 28.

At the semiconductor surface the wall portion 23 of the insulation zone has a closed geometry, with the exception of an interruption at the area of the aperture 29, and is in the form of a U or horseshoe. The wall portion 23 surrounds the region of the one conductivity type, which comprises the first zone 24, 25, 26 and the lateral resistor 27, substantially entirely or at least for the greater part.

The further surface zone 30 extends at least at the area of the interruption in the wall portion 23 and may extend above a more or less large part of the lateral resistor 27.

The above-mentioned point in the circuit having a suitable potential for the further zone 30 is, for example, the insulation zone, in particular if the circuit element is a bipolar transistor. Actually, a potential will usually be applied to the insulation zone at which the p-n junction between the insulation zone and the surface layer as well as the common layer are biased in the reverse direction so as to ensure a good electric separation between the circuit element and the remaining part of the integrated circuit. In a preferred embodiment the further surface zone coheres at the surface with the wall portion of the insulation zone. For example, the interruption in the wall portion and a more or less large part of the region of the one conductivity type between the limbs of the U or horseshoe wall portion may be bridged entirely by the further surface zone. A conductive track on the insulating layer is saved by means of said internal connection.

The further surface zone 30 and the second zone 28 extend from the semiconductor surface up to the same depth in the surface layer 22. Said zones can be provided simultaneously during the manufacture so that no extra operations are necessary for the further zone 30.

A further example is a semiconductor device a cross-sectional view of part of which is shown in FIG. 5. An insulation zone 51 which surrounds the zones 52, 53 and 54 of a bipolar transistor for the greater part, is present in the semiconductor body 50. Outside the part of the surface layer 55, 56 separated by the insulation zone 51, the semiconductor zones of a further circuit element are present. In the present example said further circuit element also is a bipolar transistor. The collector zone of said transistor is constituted by the region of the one conductivity type circumferentially adjoining the insulation zone 51, the low-ohmic common layer 57 serving as a collector connection. Said collector zone is also connected to the collector zone 52 via the aperture 58 and the lateral resistor 59, 60.

The further transistor has a base zone 61 and an emitter zone 62 which is fully surrounded in the semiconductor body by the base zone 61.

Such a combination of two active circuit elements which are interconnected via a resistor frequently occurs in circuit arrangements. The second transistor is often connected as an emitter-follower. An important advantage of the invention is inter alia that no insulated islands are necessary for such emitter-followers. As a result of this said transistors require considerably less space, which, moreover, has a favourable influence on the yield during the manufacture. It is furthermore particularly favourable for the metallisation pattern on the insulation layer that the location of said transistors is not so restricted and that their location in the semiconductor body can be adapted to the metallisation pattern.

In order to reduce the series resistance in the collector zone 52, a buried layer 63 is provided in said zone so that a part of the one conductivity type is present between the second zone 53 and the bottom portion of the insulation zone 51 in which part the doping concentration in a direction transverse to the semiconductor surface increases with increasing distance to the surface and then decreases again. If the first zone is provided at the semiconductor surface with a conductive contact, as in this example the contact 68, 65, the buried layer 63 which extends below the second zone preferably extends also in a lateral direction to below said conductive contact.

The lateral resistor 59, 60 also has a low-ohmic buried part 60. This buried part 60 forms one assembly with the part 63 and said buried layer 63, 60 extends laterally in the plane of the surface layer 55, 56 up to the aperture 58 and beyond. Due to this low-ohmic buried part 60 which is at least mainly decisive of the resistance value of the lateral resistor 59, 60, this value in this example is substantially independent of the thickness of the surface layer 55, 56. This is of importance for the accuracy with which the resistance values can be realized. In manufacturing integrated circuits, a large number of circuits are usually provided simultaneously in one semiconductor wafer, the semiconductor wafer being divided into parts in one of the last stages of the manufacture. It has been found difficult in practice to provide on such a semiconductor wafer having comparatively large dimensions an epitaxial layer of accurately the same thickness all over the wafer. The influence of the occurring differences in thickness on the resistance value in small resistors having a buried layer is substantially entirely eliminated. For completeness' sake it is to be noted that for the operation of the integrated circuit the resistance value of large resistors is usually considerably less critical than that of small resistors.

An insulating layer 64 is present on the semiconductor surface and the various semiconductor zones are connected in normal manner to a pattern of conductive tracks 65 for the interconnection of the circuit elements and for the required external connections.

In particular when two buried layers of opposite conductivity types are used, as in FIG. 5 the bottom portion of the insulation zone 51 and the buried layer 60, 63, it may be of advantage in connection with the doping concentrations to be chosen and a larger freedom therein, to use a substrate of which the layer adjoining the surface shows a lower concentration, at least at the area where the bottom portion is provided, than the remaining part of the substrate, In this manner, overdoping can more easily be obtained two times successively. Such a lower-doped layer can be obtained, for example, by out-diffusion or by epitaxy. In connection with the use of the substrate 57 as a low-ohmic connection it is to be noted that such a lower-doping layer is many times thinner than the remaining part of the substrate, so that nevertheless the substrate is low-ohmic substantially throughout its thickness and at any rate over the greater part thereof.

Another possibility which also provides a larger freedom in the choice of the various doping concentrations is that which is used in the semiconductor device shown in FIG. 5. In this case the surface layer 55, 56 is a composite layer consisting of two epitaxial layers of approximately the same resistivity and, for example, approximately the same thickness. The bottom portion of the insulation zone 51 is present on and near the interface of the substrate 57 and the epitaxial layer 56. The buried layer 60, 63 is provided at the interface of the epitaxial layers 55 and 56. The two said interfaces are denoted in the Figure by broken lines 66 and 67.

When a buried layer 63 is used in the collector zone 52, a buried layer 68 is also preferably used below the base zone 61 of the further circuit element. As a result of this the collector series resistance of the second transistor is further reduced and the electric properties of the two transistors are better matched. In the present example, the buried parts 60, 63 and 68 form one assembly. For clarity it is to be noted that the bottom portion of the insulation zone 51 extends only below the base zone 53 and the lateral resistor 59, 60 and not below the base zone 61. The collector zone of the further circuit element immediately adjoins the substrate 57 with a series resistance which is as small as possible.

The last example to be described is an integrated flip-flop having a low dissipation.

FIG. 6 shows the circuit diagram of said flip-flop and FIG. 7 shows a lay-out or topology of an integrated construction according to the invention. In both Figures the various circuit elements are denoted by the same reference numerals. The circuit arrangement comprises two cross-coupled transistors $T_1$ and $T_2$ with collector resistors $R_1$ and $R_2$ as the actual bistable element, two diodes $D_1$ and $D_2$ for set and reset, and two transistors $T_3$ and $T_4$ for reading. The flip-flop may serve, for example, as a component for a memory matrix.

The integrated circuit (FIGS. 7, 8 and 9) comprises a semiconductor body 70 having a low-ohmic substrate 71 and a high-ohmic epitaxial layer 72 of the same conductivity type, in the present example of the *n*-type. The two insulated transistors $T_1$ and $T_2$ are present within insulation zones 73, 74 having a wall portion 73 and a bottom portion 74. These transistors are vertical bipolar transistors having a collector zone 75, a base zone 76 and an emitter zone 77. The base zones 76 which constitutes the second zone of the circuit elements are constructed as extensions of the insulation zone 73, 74. These zones cohere with the insulation zones 73, 74 at the semiconductor surface 78. As compared with the semiconductor device shown in FIGS. 1 and 2 a considerable space saving is obtained. The base zone 8 (FIG. 1) must be situated at a comparatively large distance from the wall portion 2 of the insulation zone, on the one hand because the wall portion is usually obtained by diffusion from the semiconductor surface 10 and this deep diffusion shows a considerable expansion also in the latter direction, and on the other hand because errors have to be taken into account which may arise during the alignment of the various photomasks for making the diffusion apertures in the masking layer for the base zone and for the wall portion of the insulation zone.

Such self-insulating transistors in which the base zone also serves for the insulation of the transistor form the subject matter of the Dutch patent application . . . (PHN. 4911) as already stated above. One of the advantages of this structure is connected with the fact that particularly in logical circuits the base-collector junction of certain transistors can sometimes come in the forward direction. In these circumstancs charge carriers are injected in the collector zone from the base zone. In the conventional integrated circuits the collector zone adjoins a substrate region of the opposite conductivity type which serves as a parasitic collector for said injected charge carriers. As a result of this large leakage currents are formed. This parasitic transistor action is avoided in the present structure.

The collector zones 75 of the said transistors $T_1$ and $T_2$ furthermore comprise a low-ohmic part in the form of a buried layer 79 as well as a contact zone 80 obtained simultaneously with the emitter zones 77.

In the semiconductor body th collector zones 75 immediately adjoin a part 81 bounded by the insulation zone of the epitaxial layer 72, which part forms a lateral resistor and is situated laterally beside the transistor between the contact zone 80 and an aperture 82 in the wall portion 73 of the insulation zone 73, 74. Via the apertures 82, said lateral resistors 81 adjoin the low-ohmic substrate 71 which comprises a connection diagrammatically denoted by the conductor 65 for the connection to the positive terminal of the supply voltage. The *n*-type substrate 71 serves as an earth plane for the circuit and conveys the most positive potential which occurs in the circuit during operation.

The insulation zones 73, 74 also form the anodes of the set and reset diodes $D_1$ and $D_2$. For that purpose the wall portions 73 show a local widening in which the cathodes 83 of the diodes $D_1$ and $D_2$ are provided simultaneously with the emitter zones 77.

The wall portions 73 in the semiconductor body furthermore cohere with base zones 84 of the transistors $T_3$ and $T_4$ connected as emitter-followers. The collector zones of said transistors $T_3$ and $T_4$ are formed by the part of the epitaxial layer 72 situated outside the insulation zone 73, 74 and they are directly connected to the low-ohmic substrate 71. Below the base zone 84 and *n*-type buried layer 85 is present. The emitter zones of said transistors are the *n*-type zones 88 which are fully sourrounded by the base zones 84.

An insulating layer 89 on which a metallisation pattern extends for the connection of the circuit elements is present on the semiconductor surface 78. The conductive tracks 60 and 63 are connected in normal manner to the emitter of the transistors $T_3$ and $T_4$, respectively, via the apertures in the insulating layer 78. The conductive tracks 61 and 62 are connected to the cathodes 83 of the diodes $D_1$ and $D_2$, respectively. The conductive track 63 connects the emitter zones 77 of the transistors $T_1$ and $T_2$ and serves for the connection to the negative terminal of the supply voltage denoted by the −V in FIG. 6.

The wall portions 73 of the insulating zones are also used for contacting the base zones 76. The conductive track 86 connects the base zone of transistor $T_1$ to the collector zone of transistor $T_2$ and the conductive track 87 connects the collector zone of transistor $T_1$ to the base zone of transistor $T_2$. The apertures in the insulating layer 89 and the contact zones 80 for the conductive contacts with the collector zones 75 are present in the immediate proximity beside the base zones 76. In general a conductive contact with the first zone of the circuit element is preferably present at the semiconductor surface between the second zone and the aperture in the wall portion of the insulation zone, the distance between the second zone and the conductive contact being smaller than that between the conductive contact and the aperture. When a further surface zone is used to increase the resistance value, as in the semiconductor device shown in FIGS. 3 and 4, the conductive contact, in this case the contact of the drain electrode 26, is present between the second zone 28 and the further surface zone 30.

The *n*-type substrate has a resistivity of, for example, approximately 0.01 ohm.cm. The epitaxial layer is, for example, approximately 5 μm thick and has, for example, a resistivity of approximately 0.6 ohm.cm. The bottom portions 74 have been obtained, for example, by diffusion of boron with a surface concentration of approximately $10^{19}$ atoms per ccm. The buried layers 79 and 85 have been obtained, for example, by diffusion of arsenic with a concentration of approximately $10^{20}$ atoms per ccm. A normal resistance per square for these layers is, for example, approximately 20 ohm. The wall portions 73 have been obtained, for example, by diffusion of boron from the semiconductor surface 78 and have a surface concentration of approximately $10^{18}$ at/ccm. The width of the wall portions at the semiconductor surface outside the local widening is, for example, approximately 10 μm. The base zones 76 and 84 have, for example, dimensions of approximately 20 μm × 20 μm and have been doped, for example, with boron with a surface concentration of approximately $10^{18}$ at/ccm and a sheet resistance of approximately 150 ohm. The dimensions of the emitter zones 77 and 88 are, for example, 10 μm × 10 μm. As a doping may be used, for example, phosphorus with a surface concentration of approximately $10^{20}$ at/ccm. The contact zones 80 obtained simultaneously with the emitter zones have, for example, dimensions of approximately 5 μm × 10 μm. The dimensions of the resistors $R_1$ and $R_2$ at the semiconductor surface are, for example, approximately 20 μm × 20 μm. With a remaining thickness of the epitaxial layer above the bottom portion 74 of approximately 3 μm, the resistance value of the resistors is approximately 2 k.ohm.

The semiconductor device shown in FIGS. 6 to 9, has a particularly compact structure with a very simple metallisation pattern which is also due to the many internal connections. The total semiconductor surface area required for the integrated flip-flop is approximately 90 μm × 100 μm. For comparison it is stated that in the conventional integrated circuits, an area of approximately 60 μm × 75 μm is necessary for a single insulated transistor with comparable dimensions.

The embodiments described can be manufactured entirely by means of the methods of growing epitaxial layers conventionally used in manufacturing semiconductor devices and the local doping by means of photoresist masking and diffusion methods. The various semiconductor zones may also be obtained, for example, by ion implantation. Furthermore, the semiconductor devices described can be assembled in normal manner in a conventional envelope.

It will be obvious that the invention is not restricted to the examples described but that many variations are possible to those skilled in the art without departing from the scope of this invention. In addition to the more commonly used silicon, germanium or $A^{III}$–$B^{V}$ compounds may be used as semiconductor materials. The insulating and/or masking layers may consist, for example, of silicon oxide, silicon nitride, aluminium oxide or combinations thereof. The metallisation pattern may be obtained, for example, by vapour deposition followed by etching of a layer of aluminium. For the conductive tracks other conductors may be used, for example, gold or molybdenum or composite layers. In addition the conductivity types of the various semiconductor zones may be interchanged. Of the bipolar transistors described the emitter zone may serve as a collector zone and the collector zone as an emitter zone. A field effect transistor as described with reference to FIGS. 3 and 4 may have, for example, an annular second zone instead of an elongate second zone, which annular zone does not cohere with the insulation zone and which surrounds the source or drain electrode at the surface. The aperture in the insulation zone may also be formed by a recess in the bottom portion. The second zone may form the emitter zone of a bipolar transistor, the wall portion and/or the bottom portion of the insulation serving, for example, as a collector zone. In addition to the second zone, a third zone of the opposite conductivity type may be present which forms, for example, the collector zone of a lateral transistor. Furthermore, the semiconductor device may comprise several circuit elements surrounded by insulation zones, in which a number of insulation zones may cohere with each other. A number of the further insulation zones may, for example, be closed entirely and/or comprise for example, complementary transistors. The lateral resistor may comprise a conductive contact, the lateral resistor forming a potentiometer of which said conductive contact serves as a centre tapping. Such a contact is present between the second zone or, if same is present, the contact of the first zone and the aperture in the insulation zone. When a further surface zone is used to increase the resistance value, said zone may consist in this case of two separated parts which are situated on oppositely located sides of the conductive contact. The further surface zone may be, for example, a continuous zone having an aperture in which the region of the one conductivity type extends up to the surface, the conductive contact being present in said aperture. If the lateral resistor comprises a low-ohmic buried part, a further surface zone of the opposite conductivity type may also be used. This further surface zone has substantially no influence on the resistance value and may be used itself, for example, as a resistance zone. In that case said further surface zone is provided with two conductive contacts. Substantially no extra space at the semiconductor surface is required for said resistor.

We claim:

1. A semiconductor device comprising:

a. a substrate of low resistivity semiconductive material of a given conductivity type, and an electrical connection to said substrate;

b. an epitaxial layer of high resistivity semiconductive material disposed on said substrate and having said given conductivity type;

c. semiconductor circuit elements formed in a surface portion of said epitaxial layer, at least one of said semiconductor circuit elements comprising at least two semiconductor zones defining an active part of said one semiconductor circuit element; and d. an electrically isolating zone substantially completely enclosing said one semiconductor circuit element except for a restricted opening positioned laterally with respect to said active part thereof, said electrically isolating zone being cup-shaped and having a bottom portion which extends at the boundary of the epitaxial layer and the substrate and a wall portion which extends from the bottom portion through the epitaxial layer up to the surface thereof, the bottom portion comprising a semiconductor layer of a second opposite conductivity type and having a higher impurity concentration than an adjoining part of the substrate, said electrically isolating zone separating said enclosed semiconductor circuit element from other semiconductor circuit elements, the shape of said isolating zone at least partially defining a lateral resistor located in said epitaxial layer and extending through said opening, said lateral resistor providing an electrically resistive path between said enclosed semiconductor circuit element and said substrate.

2. A semiconductor device as defined in claim 1, wherein at least a portion of said wall portion consists of an electrically insulating material.

3. A semiconductor device comprising:

a. a substrate of low resistivity semiconductive material of a given conductivity type, and electrical connection means connected to said substrate;

b. a first layer of high resistivity semiconductive material on said substrate and of said given conductivity type;

c. semiconductor circuit elements formed in a surface portion of said first layer, at least one of said semiconductor circuit elements comprising at least two semiconductor zones defining an active part of said one semiconductor circuit element; and d. an electrically isolating zone substantially completely enclosing said one semiconductor circuit element except for a restricted opening positioned laterally with respect to said active part thereof, said electrically isolating zone being cup-shaped and having both a bottom portion which extends at the boundary of the first layer and the substrate and a wall portion which extends from the bottom portion through the first layer up to the surface thereof, the bottom portion comprising a semiconductor layer of a second opposite conductivity type and having a higher impurity concentration than an adjoining part of the substrate, the wall portion consisting at least partly of an electrically insulating material, said electrically isolating zone separating said enclosed semiconductor circuit element from other semiconductor circuit elements, the shape of said isolating zone at least partially defining a lateral resistor located in said first layer and extending through said opening, said lateral resistor providing an electrically resistive path between said enclosed semiconductor circuit element and said substrate.

4. A semiconductor device as claimed in claim 3, comprising a further circuit element formed in a second surface portion of said first layer outside said isolation zone and spaced from said one circuit element, and wherein said substrate serves as a common low ohmic connection for said further circuit element.

5. A semiconductor device as claimed in claim 3, comprising a further surface zone formed in a second surface portion of said first layer at a portion thereof in the vicinity of said opening, said further surface zone extending partially through said first layer thereby to constrict the thickness of said first layer and increase the resistance value of the electrical path between said first one circuit element and said electrical connection means.

6. A semiconductor device as claimed in claim 3, comprising a further surface zone formed in a second surface portion of said first layer at a portion thereof in the vicinity of said opening, and means for applying an electrical potential to said further surface zone thereby to constrict current flow in the portion of said first layer adjacent to said further surface zone and increase the effective resistance value of the electrical path between said one circuit element and said electrical connection means.

7. A semiconductor device as claimed in claim 3, wherein the first layer comprises a region of low resistivity material interposed between one of said at least two semiconductor zones and said electrically isolating zone in the region of said one semiconductor circuit element.

8. A semiconductor device as defined in claim 3, wherein said opening is located in said wall portion.

9. A semiconductor device as defined in claim 3, wherein one of said semiconductor zones is conductively connected to said substrate via said resistor and the other of said zones is of opposite conductivity and coheres at the surface with said cup-shaped isolating zone.

10. A semiconductor device as defined in claim 3, characterized in that said further circuit element is a transverse bipolar transistor, said transistor including a collector zone comprising a part of said first layer and a base zone having a conductivity type opposite to that of said first layer, said base zone adjoining the surface and surrounding at least an emitter zone in the semiconductor body, and said substrate providing a collector connection to said transistor.

11. A semiconductor device as defined in claim 3, wherein said one semiconductor circuit element comprises a transverse bipolar transistor comprising a first zone formed by part of said first layer, a second zone of said second opposite conductivity type, said second zone being located within said first zone and forming a base region of said transistor, and a further zone of said given conductivity type located within said second zone.

* * * * *